United States Patent
Buckley et al.

(10) Patent No.: US 8,685,819 B2
(45) Date of Patent: Apr. 1, 2014

(54) METHOD FOR THE REALIZATION OF A CROSSBAR ARRAY OF CROSSED CONDUCTIVE OR SEMI-CONDUCTIVE ACCESS LINES

(75) Inventors: Julien Buckley, Grenoble (FR); Karim Aissou, Gradignan (FR); Thierry Baron, Saint-Egreve (FR); Gabriel Molas, Grenoble (FR)

(73) Assignees: Commissariat a l'Energie Atomique, Paris (FR); Centre National de la Recherche Scientifique, Paris (FR); Universite Joseph Fourier, Grenoble (FR)

( * ) Notice: Subject to any disclaimer, the term of this patent is extended or adjusted under 35 U.S.C. 154(b) by 413 days.

(21) Appl. No.: 13/154,726

(22) Filed: Jun. 7, 2011

(65) Prior Publication Data
US 2012/0052598 A1 Mar. 1, 2012

(30) Foreign Application Priority Data
Jun. 9, 2010 (FR) ...................................... 10 54547

(51) Int. Cl.
*H01L 21/8234* (2006.01)

(52) U.S. Cl.
USPC ..... 438/238; 438/240; 438/381; 257/E45.002

(58) Field of Classification Search
USPC ......... 438/238–242, 250–269, 381, 393–396; 257/E45.002
See application file for complete search history.

(56) References Cited

U.S. PATENT DOCUMENTS

2007/0161237 A1   7/2007   Lieber et al.
2011/0260135 A1*  10/2011  Wu et al. .......................... 257/5

OTHER PUBLICATIONS

Cerofolini et al.; "A hybrid micro-nano-molecular route for nonvolatile memories"; Semiconductor Science and Technology, 21 (2006), pp. 1315-1325.
Wu et al.; "One-kilobit cross-bar molecular memory circuits at 30 nm half-pitch fabricated by nanoimprint lithography"; Applied Physics A, 80, pp. 1173-1178, 2005.
Chen et al., "Nanoscale molecular-switch devices fabricated by imprint lithography"; American Institute of Physics, Applied Physics Letters, vol. 82, No. 10; Mar. 10, 2003, pp. 1610-1612.
Nauenheim et al.; "Nano-Crossbar Arrays for Nonvolatile Resistive RAM (RRAM) Applications"; 8th IEEE Conference on Nanotechnology, 2008, pp. 464-467.
Lee et al; "2-stack 1D-1R Cross-point Structure with Oxide Diodes as Switch Elements for High Density Resistance RAM Applications"; proceedings of IEDM, 2008, pp. 771-774.

(Continued)

Primary Examiner — H. Jey Tsai
(74) Attorney, Agent, or Firm — Pillsbury Winthrop Shaw Pittman LLP

(57) ABSTRACT

A method for making a crossbar array of crossed conductive or semi-conductive access lines on a substrate, the crossbar array including on a crossbar array insulator, in a plane parallel to the substrate, a first level of lines including a plurality of first lines parallel with each other made of a conductive or semi-conductive material; on the first level of lines, a second level of lines including a plurality of second lines parallel with each other made of a conductive or semi-conductive material, the second lines being substantially perpendicular to the first lines. The method includes forming, on the substrate, a first cavity of substantially rectangular shape; forming a second cavity of substantially rectangular shape superimposed to the first cavity, the first and second cavities intersecting each other perpendicularly so as to form a resultant cavity.

12 Claims, 5 Drawing Sheets

(56) References Cited

OTHER PUBLICATIONS

Black et al; "Polymer self assembly in semiconductor microelectronics"; IEEE IEDM, 2006.
Mansky et al; "Controlling Polymer-Surface Interactions with Random Copolymer Brushes", Science, vol. 275, Mar. 7, 1997; pp. 1458-1460, www.sciencemag.org.
Park et al; "Directed Assembly of Lamellae-Forming Block Copolymers by Using Chemically and Topographically Patterned Substrates", Advanced Materials, 2007, 19, pp. 607-611.
Melosh et al.; "Ultrahigh-Density Nanowire Lattices and Circuits"; Science, vol. 300, Apr. 4, 2003, pp. 112-115, www.sciencemag.org.

* cited by examiner

METHOD FOR THE REALIZATION OF A CROSSBAR ARRAY OF CROSSED CONDUCTIVE OR SEMI-CONDUCTIVE ACCESS LINES

The invention relates to a method for the realization of a crossbar array of crossed conductive or semi-conductive access lines. The invention finds a particularly interesting application in the field of the realization of a crossbar array of crossed access lines for a memory device, and more specifically for non-volatile memory devices.

Various methods are known allowing this type of crossbar array of crossed access lines to be realized.

Thus, the method designated SnPT ou "multi-spacer patterning technique" described in the document "A hybrid micro-nano-molecular route for nonvolatile memories" (G F Cerofolini and D Mascolo, Semicond. Sci. Technol. 21 (2006) 1315-1325) allows the realization of a first set of conductive lines crossing a second set of conductive lines. This method consists in realizing successively, for each conductive line, a conformal deposition on a substrate and an anisotropic etching.

The major disadvantage of this method lies in the fact that it necessitates as many stages of deposition and etching as lines that are produced. Now certain applications (typically memory architectures) necessitate the realization of a very high number of lines involving a high number of deposition and etching stages, leading to a high cost and a long manufacturing time.

A method is also known for the realization of a crossbar array of crossed conductive access lines using a lithography technique designated "nanoimprint"; this method is described in the document "One-kilobit cross-bar molecular memory circuits at 30-nm half-pitch fabricated by nanoimprint lithography" (Wu et al., Appl. Phys. A 80.1173-1178 (2005)). Its implementation necessitates the use of a transparent mould comprising etched structures (or cavities) on one of its faces. A resin is deposited on a substrate. A slight pressure is then exerted by the mould on the resin so that the latter fills up the cavities of the mould. The resin is then photopolymerized by emission of a UV radiation through the transparent mould.

This method also presents certain disadvantages.

A first disadvantage lies in the fact that the imperfections formed by the roughness of the sides of the cavities are transmitted to the sides of the motifs of the resin.

Furthermore, the difference between the theoretical position of a cavity and its actual position on the mould generates errors which are repeated on the alignment of several levels.

Finally, the use of the mould imposes the use of two layers of resin: a lower layer to realize a lift-off stage and an upper layer imprinted by the mould. Due to the mechanical contact of the mould with the upper layer, a premature deterioration is experienced of the surface of the mould, due to friction.

Another method described in the document US20070161237 allows the realization of a structure of crossed access lines in nanotubes of carbon; this method consists in defining zones on a substrate by chemical etching, then in realizing a vapour-phase deposition of nanotubes on these zones. On the vapour-phase deposition, the nanotubes are oriented by application of an electric field.

On the other hand, such a method does not allow the nanotubes to be positioned precisely. Thus, such a structure with crossed access lines usually presents nanotubes which are not perfectly parallel with each other and the spacing of which is approximate.

Furthermore, this technique has only been described with nanotubes of carbon or nanowires of silicon realized by chemical vapour phase deposition (CVD).

Another method for the realization of a crossbar array with crossed access lines described in the document "Nano-Crossbar Arrays for Nonvolatile Resistive RAM (RRAM) Applications", (C. Nauenheim et al., 8th IEEE Conference on Nanotechnology, 2008, pp. 464-467) uses electron beam lithography combined with a method of the lift-off type to define metallic lines spaced by 100 nm.

Apart from the very high cost of the electron beam lithography technique, this method necessitates a long time for exposure to the electron beam.

In a known manner, the method designated SNAP or "Superlattice Nanowire Pattern Transfer" described in the document "Applied physics letters, volume 82, number 10, pp. 1610-1612, 2003" allows crossed access lines to be obtained by realizing metallic or semi-conductive lines parallel with each other. The technique is based on the conversion of the control of increasing thickness of thin films towards that of the diameter and of the spacing of parallel lines, reduced respectively to 8 nm and 16 nm.

Such a method nevertheless presents disadvantages. In fact, this method allows a limited number of conductive or semi-conductive lines to be realized and therefore does not allow the whole of the surface of a substrate to be covered in a single stage. Thus, since one wishes to realize a large number of conductive or semi-conductive lines, the cost of manufacture becomes prohibitive.

Methods are also known for the realization of a crossbar array of crossed conductive or semi-conductive access lines using a photolithography technique of the UV type. Such a method is described in the document "2-stack lD-lR Crosspoint Structure with Oxide Diodes as Switch Elements for High Density Resistance RAM Applications", (Myoung-Jae Lee et al., proceedings of IEDM 2008, pp. 771-774).

This type of method also presents difficulties in so far as the width and the spacing of the conductive or semi-conductive lines are limited by the photolithography method of the UV type.

The invention therefore has more particularly the aim of remedying the disadvantages of the methods of the prior art. In this context, the invention aims to propose a method for the realization of a crossbar array of crossed conductive or semi-conductive access lines, the number of stages of which is independent of the number of lines, the positioning of the conductive or semi-conductive lines being mastered and precise.

To this end, the invention relates to a method for the realization of a crossbar array of crossed conductive or semi-conductive access lines on a substrate, with the crossbar array comprising:

on a crossbar array insulator, in a plane parallel to the substrate, a first level of lines comprising a plurality of first lines, parallel with each other, realized in a conductive or semi-conductive material;

above the first level of lines, a second level of lines comprising a plurality of second lines parallel with each other, realized in a conductive or semi-conductive material, the second lines being substantially perpendicular to the first lines, the said method being characterized in that it comprises the following stages:

forming, on the substrate, a first cavity of substantially rectangular shape;

forming a second cavity of substantially rectangular shape superimposed to the first cavity, the first and second cavities intersecting each other perpendicularly so as to form a resultant cavity;

covering the base of the resultant cavity by a layer of a first diblock copolymer comprising an array of lines formed by an alternation of lines of a first polymer and of lines of a second polymer, the lines being arranged in a parallel manner following the length of the second cavity;

withdrawing the lines of first polymer so as to form an alternation of first grooves and of lines of second polymer;

realizing a conformal deposition of a layer of a first conductive or semi-conductive material on the grooves and the lines of second polymer;

withdrawing the lines of second polymer covered by the first conductive or semi-conductive material so as to realize the first level of lines;

withdrawing selectively the material forming the second cavity so as to make accessible the base of the first cavity covered partially following its width by the first level of lines;

depositing in the first cavity, which has been made accessible, a layer of a second conductive or semi-conductive material;

covering the layer of second conductive or semi-conductive material by a layer of a second diblock copolymer comprising an array of lines formed by an alternation of lines of a third polymer and of lines of a fourth polymer, the lines being substantially perpendicular to the first lines and second lines of polymers;

withdrawing the lines of fourth polymer so as to form an alternation of second grooves and of lines of third polymer;

withdrawing in the second grooves the second conductive or semi-conductive material so as to realize the second level of lines.

It should be noted that the first and the second polymers of the first diblock copolymer are of a different chemical nature. Likewise, the third polymer and the fourth polymers of the second diblock copolymer are of a different chemical nature. On the other hand, the first copolymer and the second copolymer can be of identical chemical nature.

Owing to the invention, the number of stages of the method no longer depends on the number of conductive or semi-conductive lines which are realized. In fact, the first conductive or semi-conductive lines are realized simultaneously within the resultant cavity and the second conductive or semi-conductive lines are realized simultaneously within the first cavity. In other words, whatever the number of conductive or semi-conductive lines which are realized, the number of stages of manufacture is unchanged.

It will be noted that the method according to the invention differs fundamentally from the known methods using diblock copolymers to define in-line motifs and to etch semiconductor channels. Such a method is described for example in the document "Polymer self assembly in semiconductor microelectronics", (C. T. Black et al. IEE IEDM 2006). This method necessitates a surface which is adapted to receive the diblock copolymer and also a rectangular cavity, the width of which corresponds to a given number of lines of polymer and does not allow the realization of a second level of lines with the implementation of the same method. In fact, to deposit a diblock copolymer, it is necessary for the surface receiving it to be adapted. Now the first level of lines presents a topography which does not allow a diblock copolymer to be received. Furthermore, it is necessary to use a rectangular cavity, the direction of the length of which is parallel to that of the lines of polymers and the width of which corresponds to a given number of lines of polymers. On the contrary, the method according to the invention advantageously uses a particular arrangement of a first cavity and of a second cavity permitting a resultant cavity to be obtained, the material of the second cavity being able to be etched selectively with respect to the other materials of the structure. This resultant cavity allows a first level of lines to be realized. Then, when the second cavity is eliminated, the access to the first cavity offers the possibility of realizing a second level of lines. The dimensions of these two cavities further permit the obtaining of the sought number of lines on the two levels.

In addition, owing to the geometric precision of the arrays of lines of the diblock copolymers, lines are obtained, the spacing of which is perfectly controlled and the surface precision of which is increased.

Apart from the main characteristics which have just been mentioned in the preceding paragraph, the method of the invention can present one or several additional characteristics below, considered individually or according to all the technically realizable combinations:

the method comprises, before the deposition in the first cavity which is made accessible of a layer of a second conductive or semi-conductive material, a deposition stage of a layer of a material comprising the impedance switching properties by application of an electric field, the stage of withdrawal in the second grooves of the second conductive or semi-conductive material being accompanied by the withdrawal of the layer of material comprising switching properties;

the material comprising impedance switching properties by application of an electric field is of the type:
binary oxide;
solid electrolyte;
perovskite based on ternary oxide;
phase change material;
molecules or polymers with resistance switching characteristics; or
magnetic material able to form a tunnel junction of magnetic type or spin valve;

the first cavity comprises a width equal to a multiple of the pitch of the second diblock copolymer;

the second cavity comprises a width equal to a multiple of the pitch of the first diblock copolymer; generally, the "pitch" of the first copolymer is determined by the width (or the diameter) of a line (or of a chain) of the first polymer added to the width (or the diameter) of a line (or of a chain) of the second polymer. Likewise, the "pitch" of the second copolymer is determined by the width (or the diameter) of a line (or of a chain) of the third polymer added to the width (or the diameter) of a line (or of a chain) of the fourth polymer;

the formation stage of the first cavity is followed by following two stages:
depositing a layer of insulating material on the edges and the base of the first cavity;
depositing, on the layer of the insulating material, a layer of a material suited to be etched in a selective manner with respect to the lines of second polymer and to the insulating material;

the formation stage of the second cavity consists in:
depositing a layer of a material suited to be etched in a selective manner with respect to the materials forming the base and the edges of the first cavity;
withdrawing a portion of the layer of material such that the base of the second cavity is formed by the base of the first cavity covered by the material of the layer of the material suited to be etched in a selective manner with respect to the lines of second polymer and to the insulating material;

the stage of withdrawal of the lines of first polymer is followed by a stage of withdrawal, through the first grooves, of the material suited to be etched in a selective manner with respect to the lines of second polymer and to the layer of insulating material;

the stage or stages of covering by a diblock copolymer are realized by the following stages:
depositing the layer of diblock copolymer;
separating the phases of the deposited diblock copolymer so as to realize an alternation of lines of two different polymers;

each stage of covering by a diblock copolymer is followed by a stage of structuring such that the first diblock copolymer is confined in the resultant cavity and/or the second diblock copolymer is confined in the first cavity;

a neutralization film is deposited prior to the deposition of the first and/or second diblock copolymer;

the stage of deposition of the second conductive or semi-conductive material is followed by a stage of chemical modification of the layer of second conductive or semi-conductive material so as to obtain terminals having a chemical affinity for one of the phases of the second diblock copolymer;

one of the first or second polymers of the first diblock copolymer presents a volumic composition comprised between 0.35 and 0.65;

one of the third or fourth polymers of the second diblock copolymer presents a volumic composition comprised between 0.35 and 0.65.

Other characteristics and advantages of the invention will emerge clearly from the description which is given below, purely by way of indication and in no way restrictively, of embodiments making reference to different figures in which.

For reasons of clarity, only the elements which are useful for an understanding of the invention have been represented and this being without respecting the scale and in a diagrammatic manner. Furthermore, the elements appearing on different figures comprise the same numbers.

Figure 1:
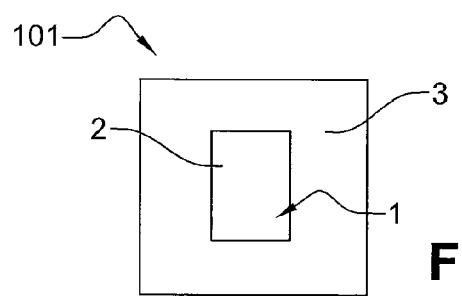
FIGS. 1 to 20 illustrate the different stages of a method for the realization of a crossbar array of crossed conductive or semi-conductive access lines according to the invention.
Figure 2:
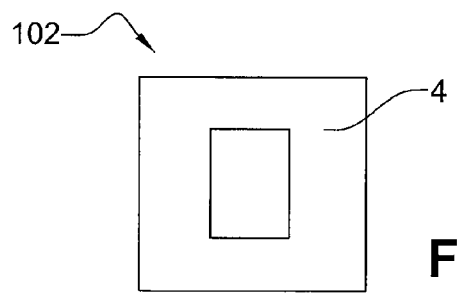
Figure 3:
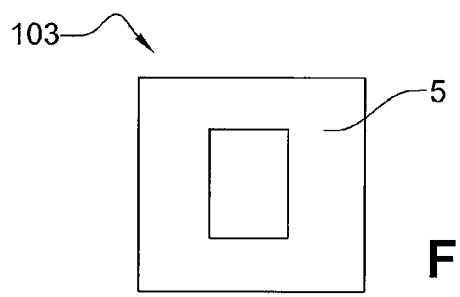

The different stages of a method according to the invention are described here with the aid of FIGS. 1 to 20.

More precisely, the realization of the first level of conductive or semi-conductive lines is illustrated in FIGS. 1 to 11.

The method according to the invention comprises a first stage 101 (FIG. 1), consisting in forming a first cavity 1, of rectangular shape, on a substrate 2, for example of silicon. To realize this first cavity 1, a deposition of a layer of silicon oxide 3, of a thickness of 50 nm, is realized on the substrate 2.

Then, so as to form the first cavity 1, a photolithography is realized of the layer of silicon oxide 3. Thus, the base and the edges of the first cavity 1 are respectively formed by the substrate 2 and the layer of silicon oxide 3.

In a general and non-restrictive manner, the deposition realized during the first stage 101 and also the depositions realized during the following stages can be realized by methods, known and mastered by the person skilled in the art, such as chemical vapour phase deposition (CVD), deposition by cathodic pulverization, deposition by electron gun or else deposition by thermal evaporation.

Furthermore, it should be emphasized that the width I1 of the first cavity 1 is determined so as to be compatible with a number of lines formed by a first polymer and a second polymer of a layer of a first diblock copolymer which will be deposited in a subsequent stage.

In the following description, each length of an element "x" is referenced by the designation Lx and each width of an element "x" is referenced by the designation lx.

A second stage 102 (FIG. 2) of the method according to the invention consists in realizing a deposition, on the base and on the edges of the first cavity 1, of a layer of an insulating material 4 of dielectric material, such as for example a silicon nitride.

A third stage 103 (FIG. 3) of the method according to the invention consists in depositing, on the layer of the insulating material 4, a layer of a material 5 of silicon oxide. The latter preferably comprises terminals of the—OH type, having a chemical affinity for one of the phases of the copolymer which will subsequently be deposited there.

A fourth stage 103 (FIGS. 4A, 4B) consists in forming a second cavity 6 of substantially rectangular shape and superimposed to the first cavity 1. The first and second cavities 1, 6 are in addition disposed in a substantially perpendicular manner (i.e. the direction of the width of one is perpendicular to the direction of the length of the other).

To do this, over the entire surface of the layer of material 5 of silicon oxide mentioned above, a layer is deposited of a material 7 of silicon nitride. An etching is then realized in the latter so as to form the second cavity 6. By way of example, the use can be cited of an etching method designated dry etching, such as an etching of the plasma type under $O_2$ or an etching method designated wet etching of the type $H_3PO_4$.

It should be noted that the base of the second cavity 6 is formed by the layer of the material 5 of silicon oxide also forming the base and the edges of the first cavity 1. It will therefore be able to be noted that the material 7 of silicon nitride is selected so as to be able to be etched in a selective manner with respect to the material 7 of silicon oxide.

Figure 4A:
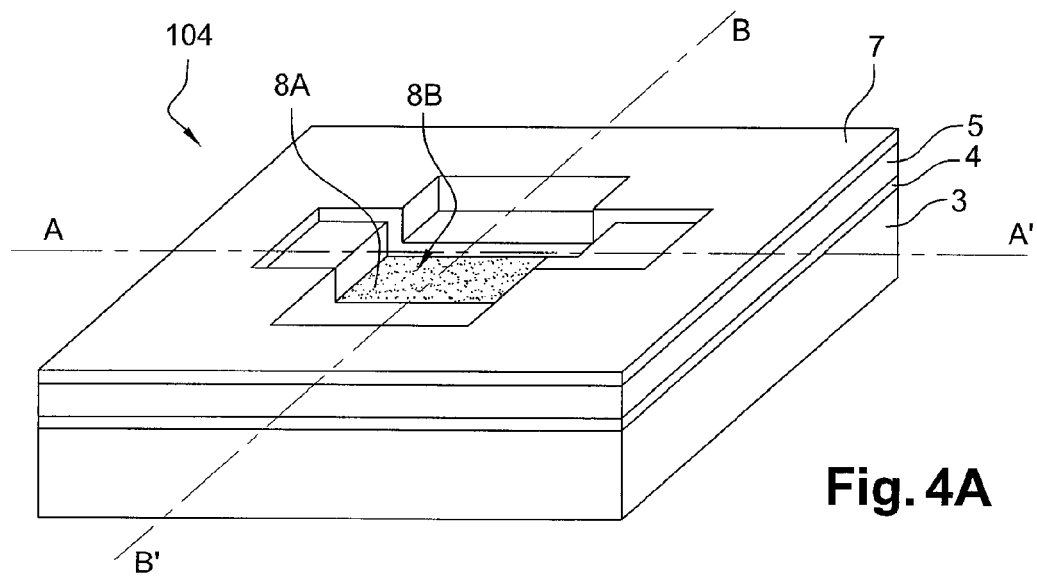

It should also be noted that this second cavity 6 is superimposed to the first cavity 1 and the crossing of the first cavity 1 with the second cavity 6 forms a resultant cavity 8B, the base of which is formed by an intersection surface 8A (illustrated in dots in FIG. 4A).

Figure 4B:
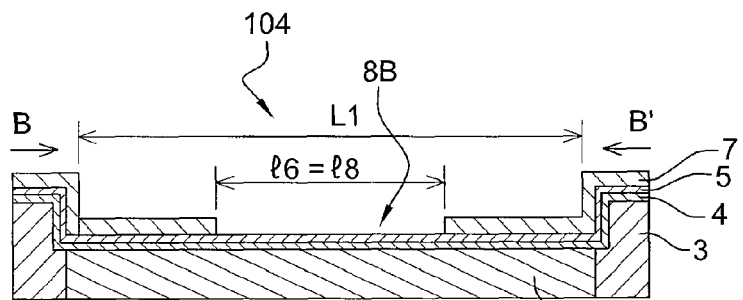
Figure 5:
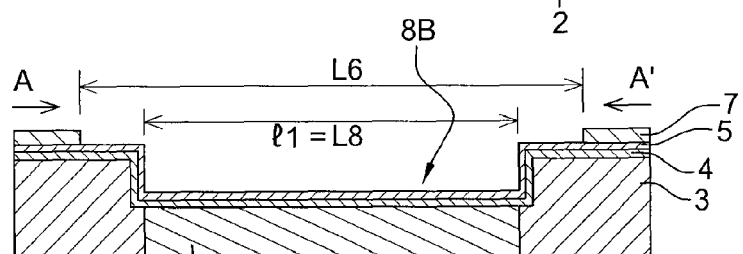
Figure 5:
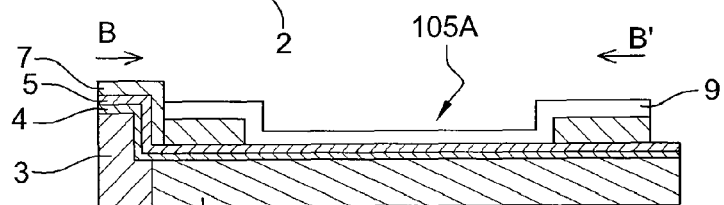
Figure 6:
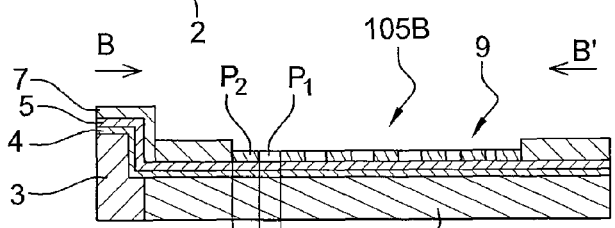
Figure 7:
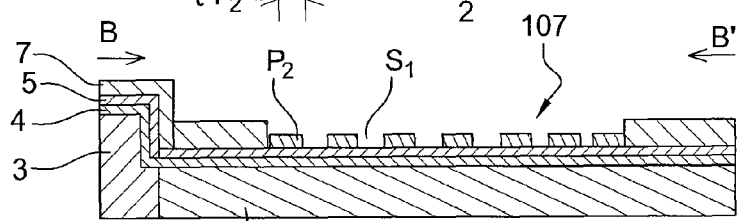
Figure 8:
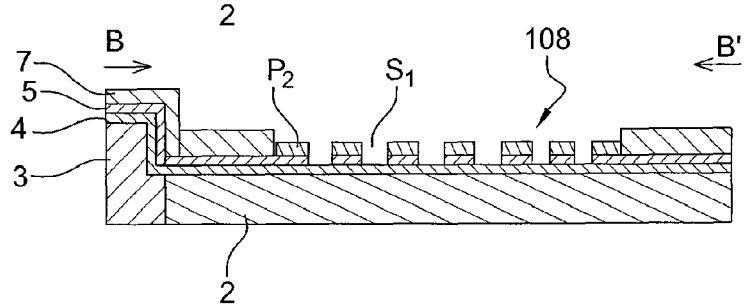
Figure 9:
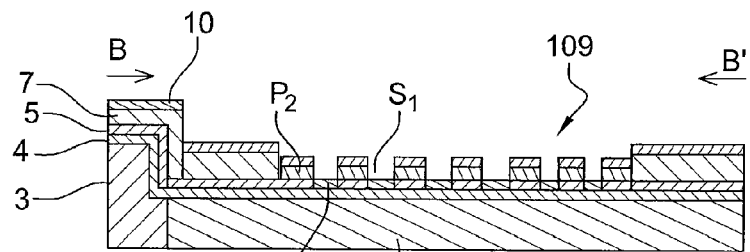
Figure 10:
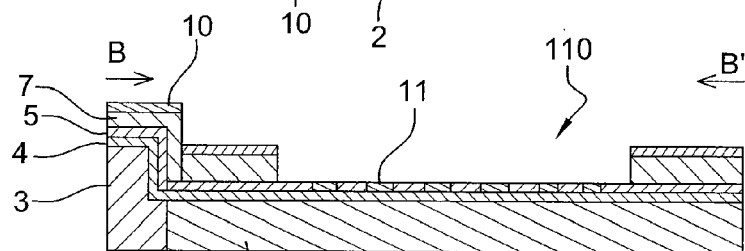
Figure 11:
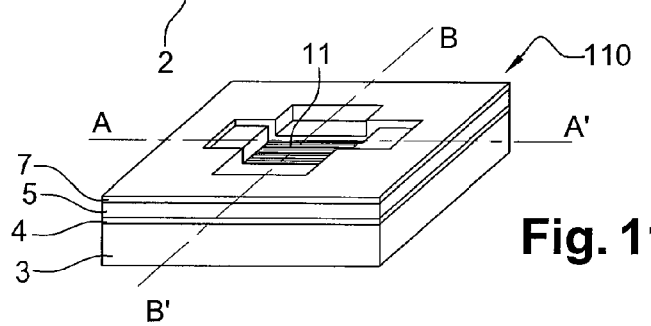
Figure 12:
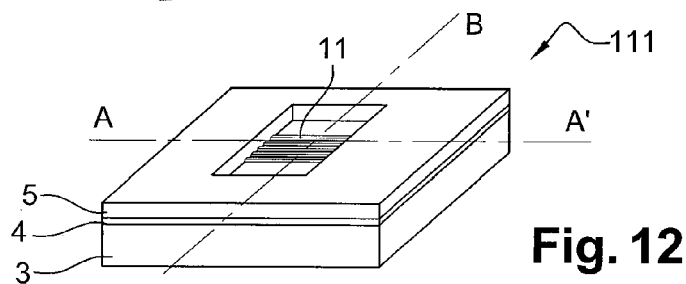
Figure 13:
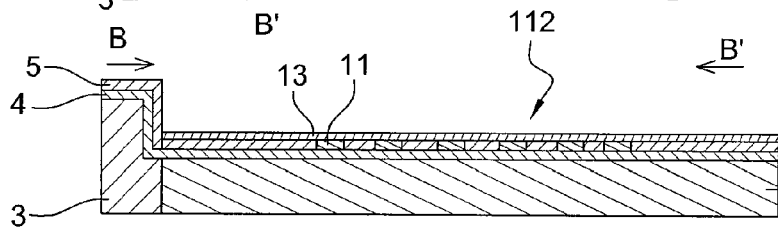
Figure 14:
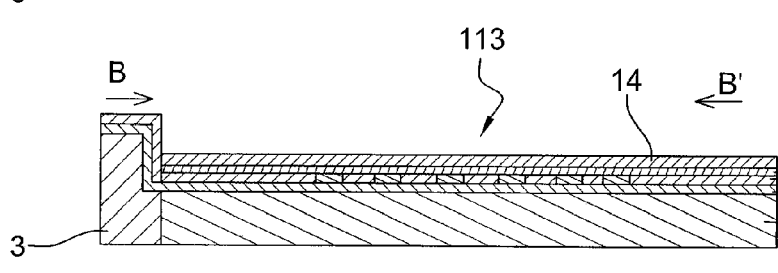
Figure 15:
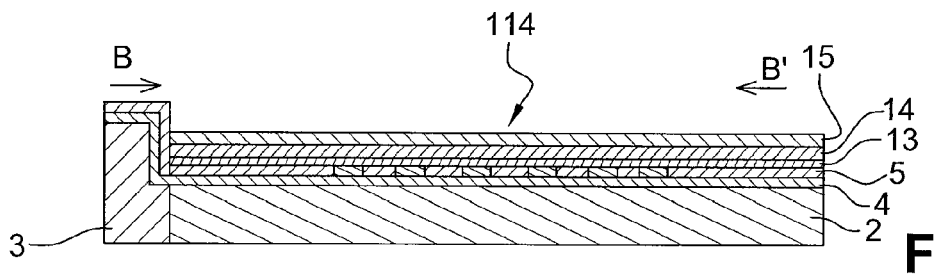
Figure 16:
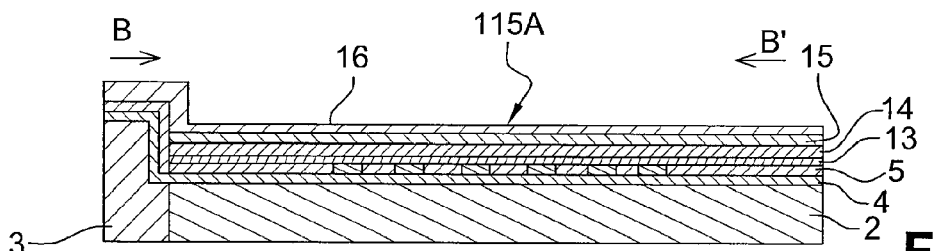
Figure 17:
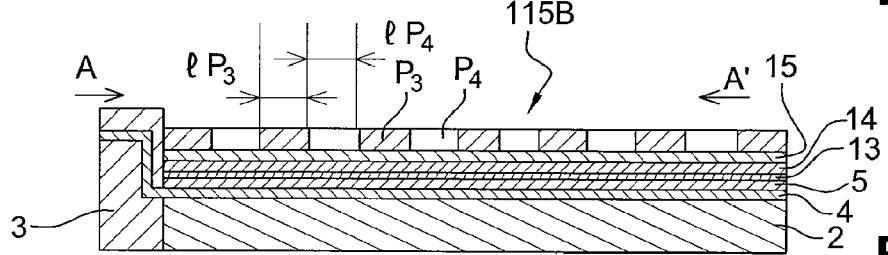
Figure 18:
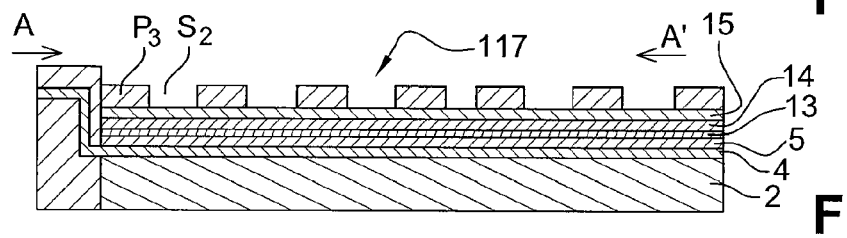
Figure 19:
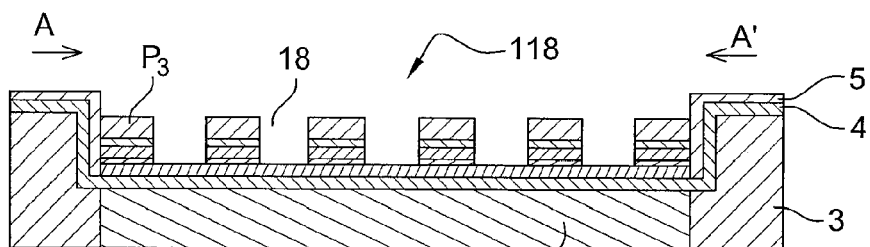
Figure 20:
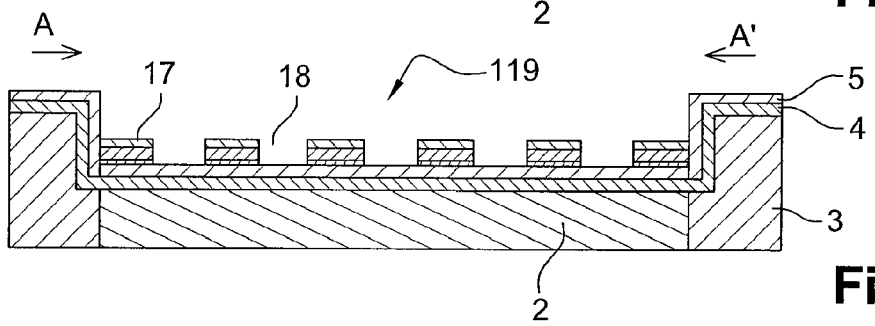

As illustrated in FIG. 4B, the resultant cavity 8B comprises a length L8 formed by the width I1 of the first cavity 1 and a width I8 formed by the width I6 of the second cavity 6.

In addition, the width I6 of the second cavity 6 is determined so as to be compatible with a number of lines formed by a third polymer and a fourth polymer of a layer of a second diblock copolymer which will be deposited in a subsequent stage.

A fifth stage of the method according to the invention consists in covering the base of the resultant cavity 8B by a layer of a first diblock copolymer 9 comprising an array of lines formed by an alternation of lines of a first polymer P1 and of lines of a second polymer P2. The lines P1, P2 are arranged parallel following the length L6 of the second cavity 6. The thickness of this layer of first diblock copolymer 9 is preferably less than the depth of the first cavity 1.

To do this, the covering stage can be realized by the following two successive stages:
depositing, according to stage 105A (FIG. 5), on the base of the resultant cavity 8B, the layer of the first diblock copolymer 9 comprising two polymers of different chemical nature and disposed at random;

separating, according to stage 105B (FIG. 6), the phases of the first diblock copolymer 9 so as to realize an array of lines formed by an alternation of lines of first polymer P1 and of lines of second polymer P2. This separation of phases can be realized for example by means of a neutralization film.

In fact, to obtain a perpendicular structure, i.e. an orientation of the chains of the first and second polymers P1, P2 which is parallel to the substrate 2, it is necessary for the interactions between the surface in contact (in this case, the layer of material 5 of silicon oxide) and the different polymers P1 and P2 to be different. As the surface in contact is not adapted, the obtaining of a perpendicular structure is then obtained by neutralizing the surface in contact. The neutralization of a surface is conventionally obtained by means of a neutralization film (not represented) which can be a film of polymer material comprising chains of polymers disposed at random.

As the layer of material 5 is of silicon oxide, a neutralization film of polymer material comprising chains of copolymer of methyl polymethacrylate and of polystyrene disposed at random can be used. An example embodiment is described by "Mansky et al. in Controlling Polymer-Surface Interactions with Random Copolymer Brushes>> Science 275, 1458, 1997".

When the composition of the copolymer is relatively symmetrical, the morphologies are designated "lamellar" or are designated "recumbent cylinder". Such structures have been described in particular in the article by Park et al "Directed Assembly of Lamallae-Forming Block Copolymers by Using Chemically and Topographically Patterned Substrates" Advanced Materials, 2007, 19, 607-611.

Furthermore, a copolymer with a structure perpendicular to the substrate which is designated lamellar is conventionally obtained when the volumic composition of the chains of polymers is adapted. As such, the volumic composition of one of the first or second polymers P1, P2 is preferably comprised between 0.35 and 0.65.

According to a variant of the method according to the invention, the covering stage can be realized by a deposition, on the base of the resultant cavity 8B, of the layer of first diblock copolymer 9 comprising an array of pre-organized lines formed by an alternation of lines of first polymer P1 and of lines of second polymer P2. Such a copolymer can be obtained by a method of thermal annealing.

In a general manner, the lines of first and of second polymers P1, P2 are arranged parallel following the length L6 of the second cavity 6.

Furthermore, the thickness of the layer of insulating material 4, deposited during the second stage 102, can be in the order of the width of a line of first polymer P1 added to the width of a line of second polymer P2, for example approximately 10 nm.

A sixth stage 105B (FIG. 6) then allows the structuring of the first diblock copolymer 9 in the resultant cavity 8B. So as to strictly position the first diblock copolymer 9 within the resultant cavity 8B, the excess is eliminated of the layer of the first diblock copolymer 9 which is disposed in the exterior of the resultant cavity 8B. Such an action can be realized, for example, by means of methods of the photolithography type and etching or mechano-chemical polishing.

Furthermore, it should be noted that the width I6 of the second cavity 6 is selected such that it is equal to a multiple of the pitch of the first diblock copolymer 9, the pitch of the first diblock copolymer 9 being formed by the width (or diameter) IP1 of a line (or of a chain) of first polymer P1 added to the width (or diameter) IP2 of a line (or of a chain) of second polymer P2.

This feature allows one to avoid constraining the layer of the first diblock copolymer 9 within the second cavity 6 and consequently within the resultant cavity 8B.

The alternation of the lines of first and second polymers P1, P2 terminates, preferably, at the two ends of the resultant cavity 8B by a line of the same polymer (in our example, the second polymer P2).

Furthermore, the pitch of the array of a copolymer is controlled by the length of the chains of polymer, whilst retaining the criterion relating to the composition of each of the polymers.

During a seventh stage 107 (FIG. 7), one of the phases of the layer of the first diblock copolymer 9 is withdrawn so as to form an alternation of first grooves S1 and of lines of second polymer P2. The layer of material 5 of silicon oxide deposited during the third stage 103 is then free at the location of the first grooves S1. If a neutralization film is used, it is also eliminated within these first grooves.

The elimination is realized by any suitable technique. By way of example, if the first polymer P1 is methyl polymethacrylate, it is possible to eliminate it selectively with respect to the second polymer P2 by means of an insulation under deep ultraviolet radiation.

An eighth stage 108 (FIG. 8) of the method according to the invention consists in withdrawing, for example by $SiO_2$ plasma CF4 etching, the said layer of material 5 of silicon oxide forming the base of the first grooves S1. It follows that the base of these latter is formed by the layer of insulating material 4. This is permitted due to the feature of the material 5 which is selected so as to be able to be etched selectively. More particularly, the latter is selected so as to be able to be etched in a selective manner with respect to the second polymer P2 and to the insulating material 4.

A ninth stage 109 (FIG. 9) of the method consists in realizing a conformal deposition of a layer of a first conductive or semi-conductive material 10, having a thickness substantially identical to that of the layer of material 5 of silicon oxide, at the base of the first grooves S1 and at the apex of the lines of second polymer P2.

Preferably, the first conductive or semi-conductive material 10 is amorphous silicon, polycrystalline silicon or any other material having metallic or semi-conductive properties. This material is deposited so as to fill at least partially the first grooves S1 and to thus form first conductive or semi-conductive lines 11 at the location of the lines of the eliminated first polymer P1.

A tenth stage 110 (FIG. 10 and FIG. 11) consists in withdrawing, for example by etching, the lines of second polymer P2. To this end, a photolithography of the lift-off type can be realized, allowing the elimination of the lines of second polymer P2 and the layer of the first conductive or semi-conductive material 10 situated at the apex of the lines of second polymer P2. One thus obtains a plurality of first conductive or semi-conductive lines 11 contained within the resultant cavity 8B. These first lines 11 are disposed on the layer of insulating material 4. More particularly, one obtains a plurality of first conductive or semi-conductive lines 11 parallel to the length L6 of the second cavity 6 or to the length L8 of the resultant cavity 8B.

An eleventh stage 111 (FIG. 12) of the method consists in realizing an etching of the selective type for example with a chemistry based on $H_3PO_4$, so as to etch the layer of the material 7 forming the second cavity 6. According to such an implementation, the layer of material 7 deposited during the fourth stage 104 is eliminated. In our example, the material 7 has been selected so as to be able to be etched selectively with respect to the material 5 of silicon oxide and to the first conductive or semi-conductive material 10.

At the conclusion of these eleven first stages, a first level of conductive or semi-conductive lines is realized. The realization of the second level of lines is described here with the aid of FIGS. 13 to 20.

A twelfth stage 112 (FIG. 13) of the method consists in depositing a layer of a material 13 above the first conductive lines 11 situated within the first cavity 1. The material of the layer 13 has impedance switching properties by application of an electric field. In a non-restrictive manner, the material of this layer of material 13 can belong to one of the following families:

- binary oxide WO3, If2O3, ZrO2, RhO2 (see U.S. Pat. No. 4,839,700), or TiO, CuO, NiO, ZrO and HfO. These oxides can be obtained by oxidation of a metal, physical vapour phase deposition or by copulverization;
- solid electrolyte: memory cell with conductive bridge comprising a soluble electrode (Ag, Cu . . . ) in contact with a material playing the role of solid electrolyte (GeSe, SiO2 oxide . . . );
- perovskite. The latter is a material based on ternary oxide of the type PCMO, SrTiO3, SrZrO3 and BaTiO3;
- phase change materials such as for example chalcogenide glasses (GeSbTe);
- molecules, polymers such as for example molecular thin films or polymers having resistance switching characteristics;
- magnetic material able to form a tunnel junction of the magnetic type or spin valve.

A thirteenth stage 113 (FIG. 14) of the method consists in depositing a layer of a second conductive or semi-conductive material 14 on the layer of material 13 deposited during the twelfth stage 112.

A fourteenth stage 114 (FIG. 15) consists in realizing a chemical modification of the surface of the layer of the second conductive or semi-conductive material 14 so as to increase there the number of —OH terminals. This feature allows the affinity to be increased with the layer of second copolymer 16 which is deposited during the following fifteenth stage. The number of —OH terminals can be increased by depositing, on the layer of the second conductive or semi-conductive material 14, a layer of a material 15 of type $HfO_2$, the free surface of which is rich in terminal —OH. This material can be deposited by ALD (Atomic Layer Deposition).

As indicated previously, a fifteenth stage of the method according to the invention consists in covering the layer of material 15 or more generally the surface of the layer of the second conductive or semi-conductive material 14 having been modified chemically by a layer of a second diblock copolymer 16 comprising an array of lines formed by an alternation of lines of a third polymer P3 and of lines of a fourth polymer P4.

To do this, the covering stage can be realized by the following two successive stages:
- depositing according to stage 115A (FIG. 16), on the layer of material 15, the layer of the second diblock copolymer 16, the layer of the second diblock copolymer 16, the layer of the second diblock copolymer 16 comprising two polymers of different chemical natures and disposed at random;
- separating according to stage 115B (FIG. 17) the phases of the second diblock copolymer 16 so as to realize an array of lines formed by an alternation of lines of third polymer P3 and of lines of fourth polymer P4. The techniques for obtaining such an array have been presented in stage 105B and are transposable to this stage 115B.

According to a variant of the method according to the invention, the covering stage of the layer of material 15 can be realized by a deposition of the second diblock copolymer 16 comprising an array of pre-organized lines formed by an alternation of lines of third polymer P3 and of lines of fourth polymer P4.

In a general manner, the lines of third and of fourth polymers P3, P4 are arranged parallel following the length L1 of the first cavity 1.

Furthermore, it should be noted that the width I1 of the first cavity 1 is selected such that it is equal to a multiple of the pitch of the second diblock copolymer 16, the pitch of the second diblock copolymer 16 being formed by the width (or diameter) IP3 of a line (or of a chain) of third polymer P3 added to the width (or diameter) IP4 of a line (or of a chain) of fourth polymer P4. This feature allows one to avoid constraining the layer of the second diblock copolymer 16 within the first cavity 1.

The alternation of the lines of third and of fourth polymers P3, P4 terminates, preferably, at the two ends of the first cavity 1 by a line of the same polymer (in our example, the third polymer P3).

Furthermore, the lines of third polymer P3 and of fourth polymer P4 are substantially perpendicular to the first conductive or semi-conductive lines 11.

A sixteenth stage 115B (FIG. 17) allows the structuring of the second diblock copolymer 16 in the first cavity 1. In a conventional manner, so as to strictly position the second diblock copolymer 16 within the first cavity 1, the excess of the layer of the second diblock copolymer 16 is eliminated which is disposed at the exterior of the first cavity 1. Such an action can be realized, for example, by means of methods of the photolithography type and etching or mechano-chemical polishing.

A seventeenth stage 117 (FIG. 18) consists in withdrawing, for example by photolithography, one of the phases (the lines of fourth polymer P4 in our example) of the layer of second diblock copolymer 16 so as to form an alternation of second grooves S2 and of lines of third polymer P3.

An eighteenth stage 118 (FIG. 19) consists in realizing an etching of the stack of the layers through the second grooves S2. More precisely, the etching is of:
- the layer of material 13 having impedance switching properties by application of an electric field;
- the layer of conductive or semi-conductive material 14;
- when such a layer is present, the layer of material 16, the free surface of which is rich in terminal —OH.

This stage is realized with the aim of obtaining an alternation of second conductive or semi-conductive lines 17.

If the thickness of copolymer does not permit the etching of all the stack, one can realize a metal lift or $Al_2O_3$ and use the metal or the $Al_2O_3$ as a mask: after deposition of the second diblock copolymer 16, one phase is eliminated with respect to the other, the metal or the $Al_2O_3$ is deposited for example by conformal ALD (Atomic Layer Deposition), then a lift-off is realized by plasma etching of the metal or of the $Al_2O_3$ deposited on the phase of the copolymer not having been eliminated; the remaining lines of $Al_2O_3$ or of metal are used as an etching mask of the stack.

The method additionally comprises a nineteenth stage 119 (FIG. 20) during which the lines of third polymer P3 of the layer of second copolymer 16 are withdrawn. To do this, it is possible to realize an etching of the photolithography type.

Figure 21:
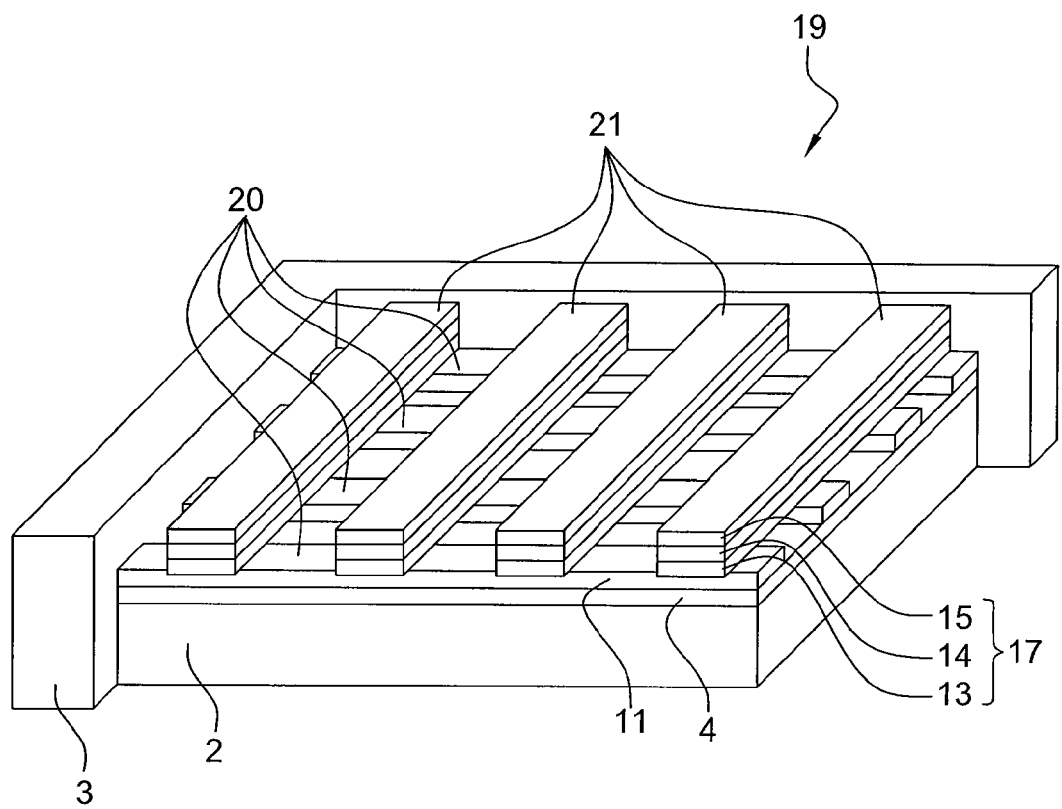
FIG. 21 represents diagrammatically a crossbar array of crossed conductive or semi-conductive access lines obtained directly by the implementation of the method according to the invention.

The final structure of a crossbar array 19 directly obtained by the implementation of the realization method is illustrated in FIG. 21. Such a crossbar array 19 comprises a first level 20 of lines formed by the first conductive or semi-conductive lines 11 and a second level 21 of lines formed by the second conductive or semi-conductive lines 17. More precisely, the crossbar array 19 comprises on the layer of insulating material 4, in a plane parallel to the substrate 2, a first level 20 of lines comprising a plurality of first lines 11 realized in the first conductive or semi-conductive material 10. Furthermore, on the first level 20 of lines 11 there is a second level 21 of lines comprising a plurality of second lines 17 realized in the second conductive or semi-conductive material 14. The second lines 17 are substantially perpendicular to the first lines 11.

The first and second cavities 1, 6 realized respectively during the first stage 101 and the fourth stage 104 are realized in micrometric dimensions.

Furthermore, the first and second diblock copolymers 9, 16 can, for example, each comprise a polymer of the methyl polymethacrylate type and a polymer of the polystyrene type.

In a non-restrictive manner, the pitch of the first and second copolymers 9, 16 can be in the order of 20 nm.

Furthermore, the layer of silicon oxide 3 deposited during the first stage 101 for formation of the first cavity 1 has a thickness of 50 nm or more so as to be greater than or equal to the sum of the thicknesses of the layer 13 having impedance switching properties by application of an electric field, the layer of the second conductive or semi-conductive material 14, the layer of a material 15 the free surface of which is rich in terminal —OH, and the layer of the second diblock copolymer 16.

Owing to the method of the invention, the cost and the time for realization of a crossbar array 19 obtained by the implementation of the method of the invention is not dependent on the number of conductive or semi-conductive lines which are realized.

Furthermore, the method of the invention permits in particular:
realizing conductive or semi-conductive lines on almost the whole of the surface of a substrate;
spacing with precision conductive or semi-conductive lines by a given distance.

The invention is described above by way of example; it is understood that the person skilled in the art is able to realize different variants of the method for realization of a crossbar array of crossed conductive or semi-conductive access lines, in particular concerning the technologies of etching and of depositions used without, however, departing from the framework of the patent.

The invention claimed is:

1. A method for manufacturing a crossbar array of crossed conductive or semi-conductive access lines on a substrate, the crossbar array comprising:
on a crossbar array insulator, in a plane parallel to the substrate, a first level of lines comprising a plurality of first lines parallel to each other made of a conductive or semi-conductive material;
above the first level of lines, a second level of lines comprising a plurality of second lines parallel to each other made of a conductive or semi-conductive material, the second lines being substantially perpendicular to the first lines,
said method comprising:
forming, on the substrate, a first cavity of substantially rectangular shape;
forming a second cavity of substantially rectangular shape superimposed to the first cavity, the first and second cavities intersecting each other perpendicularly so as to form a resultant cavity;
covering a base of the resultant cavity by a layer of a first diblock copolymer comprising an array of lines formed by an alternation of lines of a first polymer and of lines of a second polymer, the lines being arranged parallel following the length of the second cavity;
withdrawing the lines of first polymer so as to form an alternation of first grooves and of lines of second polymer;
performing a conformal deposition of a layer of a first conductive or semi-conductive material on the grooves and the lines of second polymer;
withdrawing the lines of second polymer covered by the first conductive or semi-conductive material so as to form the first level of lines;
withdrawing selectively the material forming the second cavity so as to make accessible the base of the first cavity covered partially following its width by the first level of lines;
depositing in the first cavity, which has been made accessible, a layer of a second conductive or semi-conductive material;
covering the layer of second conductive or semi-conductive material, by a layer of a second diblock copolymer comprising an array of lines formed by an alternation of lines of a third polymer and of lines of a fourth polymer, the lines being substantially perpendicular to the first lines and second lines of polymers;
withdrawing the lines of fourth polymer so as to form an alternation of second grooves and of lines of third polymer;
withdrawing in the second grooves the second conductive or semi-conductive material so as to realize form the second level of lines.

2. The method according to claim 1, comprising, before depositing in the first cavity, which has been made accessible, a layer of a second conductive or semi-conductive material, depositing a layer of a material comprising impedance switching properties by application of an electric field, the withdrawing in the second grooves of the second conductive or semi-conductive material being accompanied by the withdrawal of the layer of material comprising switching properties.

3. The method according to claim 2, wherein the material comprising impedance switching properties by application of an electric field is a:
binary oxide;
solid electrolyte;
perovskite based on ternary oxide;
phase change material;
molecules or polymers with resistance switching properties; or
magnetic material able to form a tunnel junction of the magnetic type or spin valve.

4. The method according to claim 1, wherein:
the first cavity comprises a width equal to a multiple of the pitch of the second diblock copolymer;
the second cavity comprises a width equal to a multiple of the pitch of the first diblock copolymer.

5. Method The method according to claim 1, wherein forming the first cavity is followed by:
depositing a layer of insulating material on the edges and the base of the first cavity;

depositing, on the layer of the insulating material, a layer of a material suited to be etched in a selective manner with respect to the lines of second polymer and to the insulating material.

6. The method according to claim 1, wherein forming the second cavity includes:

depositing a layer of a material suited to be etched in a selective manner with respect to the materials forming the base and the edges of the first cavity;

withdrawing a portion of the layer of material such that the base of the second cavity is formed by the base of the first cavity covered by the material of the layer of the material suited to be etched in a selective manner with respect to the lines of second polymer and to the insulating material.

7. The method according to claim 5, wherein withdrawing the lines of first polymer is followed by withdrawing, through the first grooves, of the material suited to be etched in a selective manner with respect to the lines of second polymer and to the layer of insulating material.

8. The method according to claim 1, wherein covering by a diblock copolymer includes:

depositing the layer of diblock copolymer;

separating the phases of the diblock copolymer deposited so as to form an alternation of lines of two different polymers.

9. The method according to claim 1, wherein each stage of covering by a diblock copolymer is followed by a structuring stage such that the first diblock copolymer is confined in the resultant cavity and/or the second diblock copolymer is confined in the first cavity.

10. The method according to claim 1, comprising depositing a neutralization film prior to depositing the first and/or second diblock copolymer.

11. The method according to claim 1, wherein following depositing the second conductive or semi-conductive material the method comprises chemically modifying the layer of second conductive or semi-conductive material so as to obtain terminals having a chemical affinity for one of the phases of the second diblock copolymer.

12. The method according to claim 1, wherein:

one of the first or second polymers of the first diblock copolymer has a volumic composition comprised between 0.35 and 0.65;

one of the third or fourth polymers of the second diblock copolymer has a volumic composition comprised between 0.35 and 0.65.

* * * * *

UNITED STATES PATENT AND TRADEMARK OFFICE
CERTIFICATE OF CORRECTION

PATENT NO.        : 8,685,819 B2
APPLICATION NO.   : 13/154726
DATED             : April 1, 2014
INVENTOR(S)       : Julien Buckley et al.

Page 1 of 1

It is certified that error appears in the above-identified patent and that said Letters Patent is hereby corrected as shown below:

On title page, item (73) Assignees
replace "Commissariat a l'Energie Atomique, Paris (FR)"
with -- Commissariat à l'énergie atomique et aux énergies alternatives, Paris (FR) --.

Signed and Sealed this
Seventeenth Day of June, 2014

Michelle K. Lee
*Deputy Director of the United States Patent and Trademark Office*